United States Patent
Lee

(10) Patent No.: US 8,762,623 B2
(45) Date of Patent: Jun. 24, 2014

(54) METHOD FOR MANAGING A PLURALITY OF BLOCKS OF A FLASH MEMORY, AND ASSOCIATED MEMORY DEVICE AND CONTROLLER THEREOF

(75) Inventor: Chun-Kun Lee, Hsinchu County (TW)

(73) Assignees: Silicon Motion Inc., Tianan Digital, Futian, Shenzhen, Guangdong (CN); Silicon Motion Inc., Jhubei, Hsinchu County (TW)

( * ) Notice: Subject to any disclaimer, the term of this patent is extended or adjusted under 35 U.S.C. 154(b) by 344 days.

(21) Appl. No.: 12/606,190

(22) Filed: Oct. 27, 2009

(65) Prior Publication Data

US 2010/0306455 A1    Dec. 2, 2010

(30) Foreign Application Priority Data

May 26, 2009    (TW) ................................ 98117505 A

(51) Int. Cl.
| | |
|---|---|
| *G06F 12/00* | (2006.01) |
| *G06F 13/00* | (2006.01) |
| *G06F 13/28* | (2006.01) |
| *G06F 12/02* | (2006.01) |
| *G11C 16/10* | (2006.01) |
| *G06F 3/06* | (2006.01) |

(52) U.S. Cl.
CPC .......... *G06F 12/0246* (2013.01); *G11C 16/102* (2013.01); *G06F 3/0679* (2013.01)
USPC ....................................................... 711/103

(58) Field of Classification Search
USPC ......................................................... 711/103
See application file for complete search history.

(56) References Cited

U.S. PATENT DOCUMENTS

| | | | | |
|---|---|---|---|---|
| 7,783,798 | B1* | 8/2010 | Misra et al. ..................... | 710/60 |
| 7,996,642 | B1* | 8/2011 | Smith ............................ | 711/167 |
| 8,090,899 | B1* | 1/2012 | Syu ............................... | 711/103 |
| 2007/0186032 | A1* | 8/2007 | Sinclair et al. ................ | 711/103 |
| 2008/0282024 | A1* | 11/2008 | Biswas et al. ................. | 711/103 |
| 2009/0198947 | A1* | 8/2009 | Khmelnitsky et al. ........ | 711/202 |

FOREIGN PATENT DOCUMENTS

| | | |
|---|---|---|
| CN | 101320594 A | 12/2008 |
| TW | 573250 | 1/2004 |

* cited by examiner

*Primary Examiner* — Matthew Bradley
*Assistant Examiner* — Craig Goldschmidt
(74) *Attorney, Agent, or Firm* — Winston Hsu; Scott Margo

(57) ABSTRACT

A method for managing a plurality of blocks of a Flash memory includes: sieving out at least one first block having invalid pages from the plurality of blocks; and moving data of a portion of valid pages of the first block to a second block, where data of all valid pages of the first block is not moved to the second block at a time. An associated memory device and a controller thereof are also provided, where the controller includes: a ROM arranged to store a program code; and a microprocessor arranged to execute the program code to control the access to the Flash memory and manage the plurality of blocks. The controller that executes the program code by utilizing the microprocessor sieves out the first block from the plurality of blocks, and moves the data of the portion of valid pages of the first block to the second block.

48 Claims, 6 Drawing Sheets

METHOD FOR MANAGING A PLURALITY OF BLOCKS OF A FLASH MEMORY, AND ASSOCIATED MEMORY DEVICE AND CONTROLLER THEREOF

BACKGROUND OF THE INVENTION

1. Field of the Invention

The present invention relates to access to a Flash memory, and more particularly, to a method for managing a plurality of blocks of a Flash memory, and to an associated memory device and a controller thereof.

2. Description of the Prior Art

As technologies of Flash memories progress in recent years, many kinds of portable memory devices, such as memory cards respectively complying with SD/MMC, CF, MS, and XD standards, are widely implemented in various applications. Therefore, the control of access to Flash memories in these portable memory devices has become an important issue.

Taking NAND Flash memories as an example, they can mainly be divided into two types, i.e. Single Level Cell (SLC) Flash memories and Multiple Level Cell (MLC) Flash memories. Each transistor that is considered a memory cell in SLC Flash memories only has two charge levels that respectively represent a logical value 0 and a logical value 1. In addition, the storage capability of each transistor that is considered a memory cell in MLC Flash memories can be fully utilized. More specifically, the voltage for driving memory cells in the MLC Flash memories is typically higher than that in the SLC Flash memories, and different voltage levels can be applied to the memory cells in the MLC Flash memories in order to record information of two bits (e.g. binary values 00, 01, 11, or 10) in a transistor that is considered a memory cell. Theoretically, the storage density of the MLC Flash memories may reach twice the storage density of the SLC Flash memories, which is considered good news for NAND Flash memory manufacturers who encountered a bottleneck of NAND Flash technologies.

As MLC Flash memories are cheaper than SLC Flash memories, and are capable of providing higher capacity than SLC Flash memories while the space is limited, MLC Flash memories have been a main stream for implementation of most portable memory devices on the market. According to the related art, it is possible to further increase the storage density of the MLC Flash memories to achieve more than twice the storage density of the SLC Flash memories. However, various problems of the MLC Flash memories have arisen due to their unstable characteristics. Please note that there are some side effects when such a method of increasing the storage density is applied to the MLC Flash memories. For example, the endurance of the MLC Flash memories may become lower, the reading/writing speed may decrease, the probability of the occurrence of reading/writing errors may increase, and some problems may occur when implementing certain kinds of portable memory devices, such as memory cards complying with the SD standards.

More particularly, as the storage density increases, the page count of each block increases correspondingly. As a result, when a portable memory device implemented according to such a method of increasing the storage density is performing a merging operation, the portable memory device can hardly comply with a certain time out specification of the SD standards due to the high page count. Therefore, a novel method is required for enhancing the control of data access of a Flash memory in a portable memory device, in order to guarantee that the portable memory device can operate normally in a situation where the storage density of the Flash memory increases.

SUMMARY OF THE INVENTION

It is therefore an objective of the claimed invention to provide a method for managing a plurality of blocks of a Flash memory, and to provide an associated memory device and a controller thereof, in order to solve the above-mentioned problems.

It is another objective of the claimed invention to provide a method for managing a plurality of blocks of a Flash memory, and to provide an associated memory device and a controller thereof, in order to reduce the number of merging operations of blocks within the Flash memory, and even have no need to perform merging operations.

According to a preferred embodiment of the claimed invention, a method for managing a plurality of blocks of a Flash memory comprises: sieving out at least one first block having invalid pages from the plurality of blocks; and moving data of a portion of valid pages of the first block to a second block, wherein data of all valid pages of the first block is not moved to the second block at a time.

While the method mentioned above is disclosed, an associated memory device is further provided. The memory device comprises: a Flash memory comprising a plurality of blocks; and a controller arranged to access the Flash memory and manage the plurality of blocks, wherein the controller sieves out at least one first block having invalid pages from the plurality of blocks, and moves data of a portion of valid pages of the first block to a second block, wherein data of all valid pages of the first block is not moved to the second block at a time.

While the method mentioned above is disclosed, a controller of a memory device is further provided, wherein the controller is utilized for accessing a Flash memory comprising a plurality of blocks. The controller comprises: a read only memory (ROM) arranged to store a program code; and a microprocessor arranged to execute the program code to control the access to the Flash memory and manage the plurality of blocks. The controller that executes the program code by utilizing the microprocessor sieves out at least one first block having invalid pages from the plurality of blocks, and moves data of a portion of valid pages of the first block to a second block, wherein data of all valid pages of the first block is not moved to the second block at a time.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
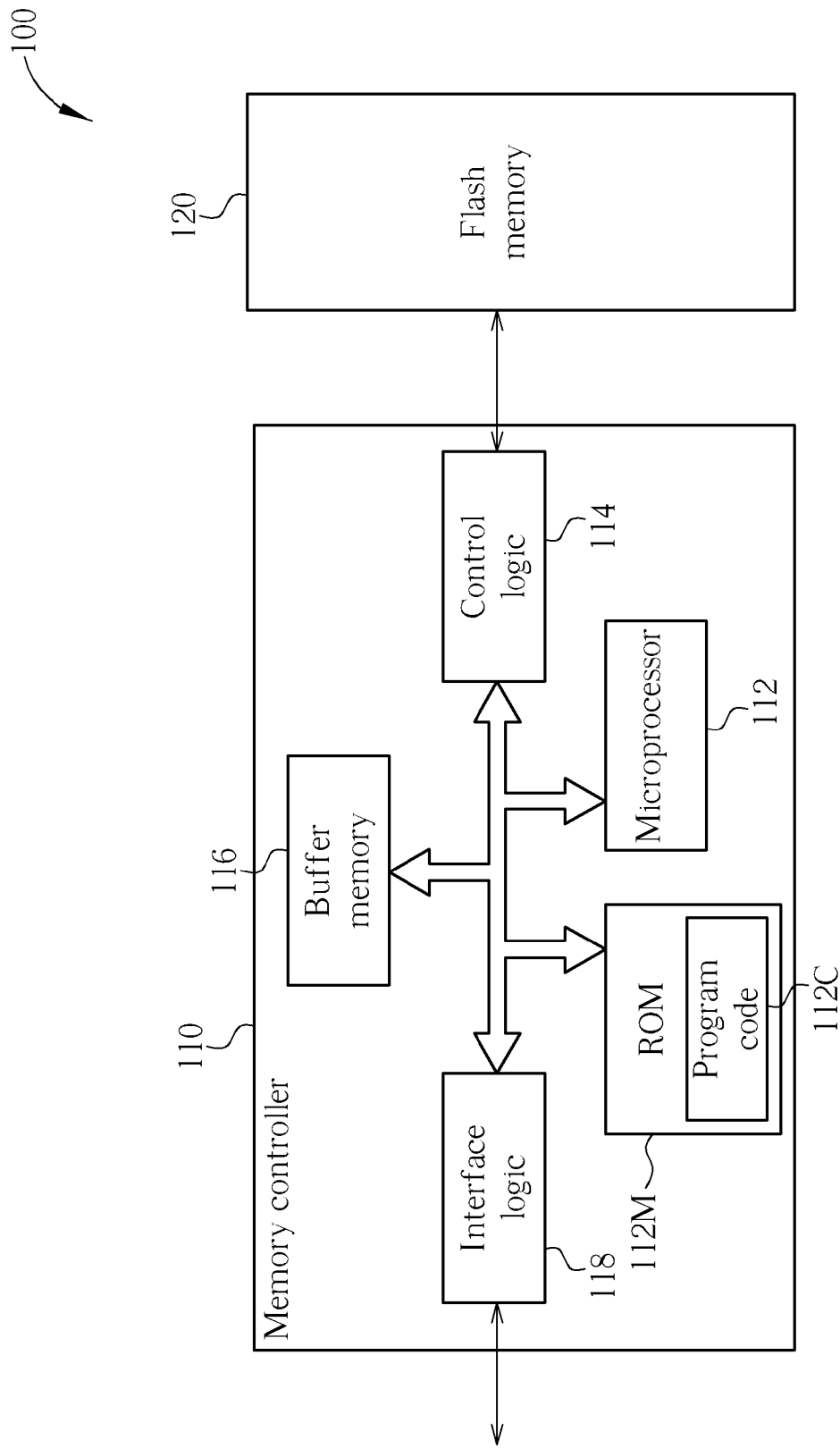
FIG. 1 is a diagram of a memory device according to a first embodiment of the present invention.

Please refer to FIG. 1, which illustrates a diagram of a memory device 100 according to a first embodiment of the present invention. In particular, the memory device 100 of this embodiment is a portable memory device, such as a memory card complying with SD/MMC, CF, MS, or XD standards. The memory device 100 comprises a Flash memory 120, and further comprises a controller arranged to access the Flash memory 120, where the aforementioned controller of this embodiment is a memory controller 110. According to this embodiment, the memory controller 110 comprises a microprocessor 112, a read only memory (ROM) 112M, a control logic 114, a buffer memory 116, and an interface logic 118. The ROM 112M is arranged to store a program code 112C, and the microprocessor 112 is arranged to execute the program code 112C to control the access to the Flash memory 120. Please note that, according to different variations of this embodiment, the program code 112C can be stored in the buffer memory 116 or any other memory.

Typically, the Flash memory 120 comprises a plurality of blocks, and the controller (e.g. the memory controller 110 that executes the program code 112C by utilizing the microprocessor 112) performs data erasure operations on the Flash memory 120 by erasing in units of blocks. In addition, a block can be utilized for recording a specific amount of pages, where the controller mentioned above performs data writing operations on the Flash memory 120 by writing/programming in units of pages.

In practice, the memory controller 110 that executes the program code 112C by utilizing the microprocessor 112 is capable of performing various control operations by utilizing the internal components within the memory controller 110. For example, the memory controller 110 utilizes the control logic 114 to control access to the Flash memory 120 (e.g. operations of accessing at least one block or at least one page), utilizes the buffer memory 116 to perform buffering operations for the memory controller 110, and utilizes the interface logic 118 to communicate with a host device.

According to this embodiment, in addition to accessing the Flash memory 120, the controller is capable of properly managing the plurality of blocks. More specifically, the controller can sieve out at least one first block having invalid pages from the plurality of blocks, and move data of a portion of valid pages of the first block to a second block, in order to enhance the performance of the block management thereof. The controller of this embodiment can read a portion of valid pages of the first block and copy these valid pages to the second block, where data of all valid pages of the first block is not moved to the second block at a time. Additionally, valid pages of a specific block represent pages storing the latest or effective information, where the valid pages actually link to a certain or more logical addresses. On the contrary, invalid pages of a specific block represent pages storing older or ineffective information, where the invalid pages do not actually link to any logical address. For example, the host device requests the memory controller 110 to store a page of information Data 1 whose logical page address is LPA 1 into the Flash memory 120, and the Flash memory 120 stores the information Data 1 into the first physical page of the first physical block of the Flash memory 120. As the first physical page stores the latest information for the logical page address LPA 1, the first physical page is a valid page. Afterward, the host device requests the memory controller 110 to store a page of updated information Data 2 for the logical page address LPA 1 into the Flash memory 120, and the Flash memory 120 stores the updated information Data 2 into a second physical page of the first physical block of the Flash memory 120 or a physical page of another physical block. As the information Data 1 stored in the first physical page of the first physical block is not the latest information for the logical page address LPA 1, the first physical page becomes an invalid page. Please refer to FIG. 2 for further details.

Figure 2:
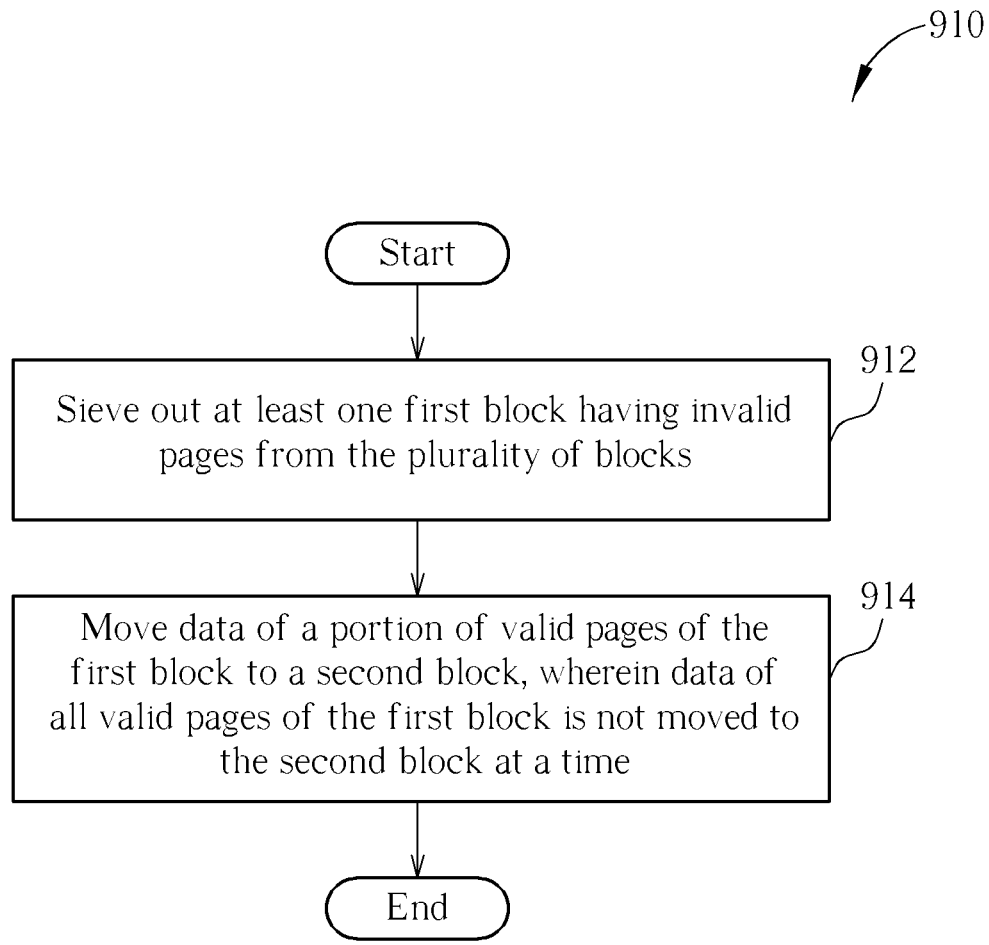
FIG. 2 is a flowchart of a method for managing a plurality of blocks of a Flash memory according to one embodiment of the present invention.

FIG. 2 is a flowchart of a method 910 for managing a plurality of blocks of a Flash memory according to one embodiment of the present invention. The method can be applied to the memory device 100 shown in FIG. 1, and more particularly, to the controller mentioned above (e.g. the memory controller 110 that executes the program code 112C by utilizing the microprocessor 112). In addition, the method can be implemented by utilizing the memory device 100 shown in FIG. 1, and more particularly, by utilizing the controller mentioned above. The method 910 is described as follows.

In Step 912, the aforementioned controller (e.g. the memory controller 110 that executes the program code 112C by utilizing the microprocessor 112) sieves out at least one first block having invalid pages from the plurality of blocks. According to this embodiment, the controller records the invalid page counts of at least a portion of blocks within the plurality of blocks, and updates the invalid page counts of the portion of blocks at any time when needed. Thus, the controller can sieve out the first block having the invalid pages from the plurality of blocks according to the invalid page counts of the portion of blocks.

According to this embodiment, the more invalid page count of the block sieved out in Step 912, the better the controller's performance of block management. For example, the controller can sieve out at least one block having more invalid pages than others from the plurality of blocks as the first block. In another example, the controller can sieve out at least one block having the most invalid pages among others from the plurality of blocks as the first block.

In Step 914, the controller moves data of a portion of valid pages of the first block to a second block, where the data of all valid pages of the first block is not moved to the second block at a time. According to this embodiment, when receiving a writing command from the host device mentioned above, the controller writes data corresponding to the writing command into the second block and moves the data of the portion of valid pages of the first block to the second block. For example, the controller can move the data of the portion of valid pages of the first block to the second block before or after writing the data corresponding to the writing command into the second block. Thus, the controller can move the data of the valid pages of the first block to the second block in batches, at respective times.

According to this embodiment, the controller can record the invalid page counts of the portion of blocks (or all of the plurality of blocks) and update the invalid page counts of the portion of blocks (or all of the plurality of blocks) at any time when needed, and can further sieve out the first block having the invalid pages from the plurality of blocks according to the invalid page counts of the portion of blocks (or all of the plurality of blocks). This is for illustrative purposes only, and is not meant to be a limitation of the present invention. According to variations of this embodiment, the controller can record the valid page counts of a portion of blocks (or all of the plurality of blocks) and update the valid page counts of the portion of blocks (or all of the plurality of blocks) at any time when needed, and can further sieve out the first block having the invalid pages from the plurality of blocks according to the valid page counts of the portion of blocks (or all of the plurality of blocks).

In addition, by utilizing the writing command, the controller of this embodiment can trigger the operation of moving the data of the portion of valid pages of the first block to the second block. This is for illustrative purposes only, and is not meant to be a limitation of the present invention. According to some other events or at least one criterion, the controller can also trigger the operation of moving the data of the portion of valid pages of the first block to the second block. For example, the aforementioned at least one criterion may comprise: whether a timer indicates that the current time reaches a predetermined time or a predetermined period, or whether a counter indicates that the number of times of moving the data of the portion of the valid pages of the first block to the second block does not reach a predetermined time, or whether a flag indicates that the data of the portion of the valid pages of the first block is not completely moved to the second block, or whether there is insufficient blank/programmable memory space (e.g. insufficient blank/programmable blocks or pages) within the Flash memory 120, or whether merging operations are required.

In contrast to the related art, as the memory controller 110 of this embodiment operates in a prophylactic manner by often recycling storage space of valid pages in the blocks (e.g. those having one or more invalid pages) for further use, the present invention can reduce the number of merging operations of blocks within the Flash memory 120. Therefore, the present invention can provide the portable memory devices with better performance. In addition, the memory controller 110 of the present invention is capable of moving the data of the valid pages of the first block to the second block in batches, at respective times. Therefore, the present invention can prevent the related art problem of hardly complying with the time out specification of the SD standards due to the high page count.

Figure 3:
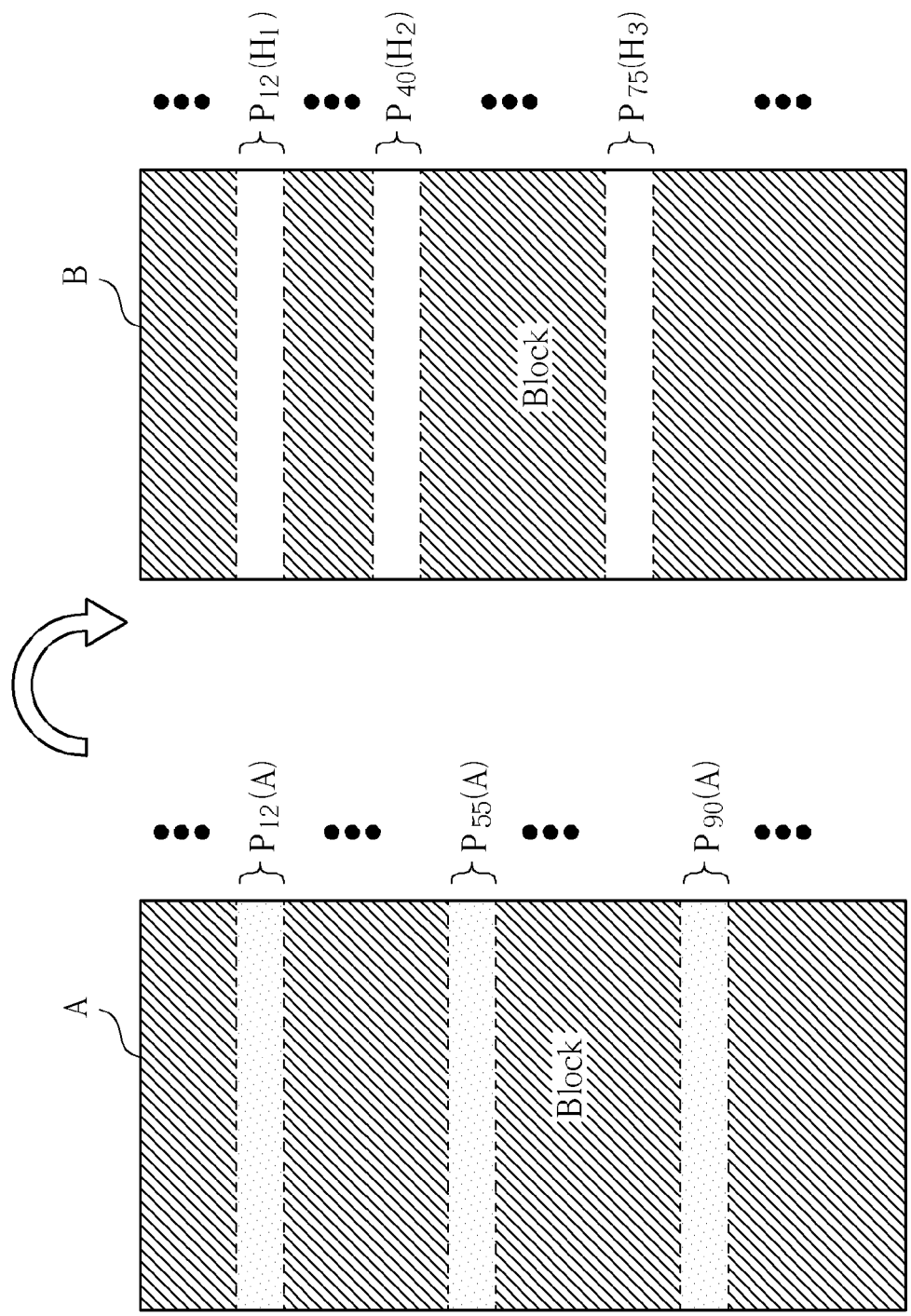
FIG. 3 is a diagram illustrating certain blocks involved with the method shown in FIG. 2 according to an embodiment of the present invention.

FIG. 3 is a diagram illustrating certain blocks involved with the method shown in FIG. 2 according to an embodiment of the present invention, where this embodiment is a variation of the embodiment shown in FIG. 2. Here, the blocks A and B respectively represent the first block and the second block mentioned above. The memory controller 110 can move the data of the valid pages of the first block A (e.g. the shaded portion, such as the pages except for $P_{12}(A)$, $P_{55}(A)$, and $P_{90}(A)$) to the second block B in batches, at respective times. In this embodiment, when receiving a writing command $H_1$ from the host device mentioned above, the memory controller 110 first moves a portion of valid pages within the first block A (e.g. the valid pages located at the first through to the twelfth pages $Fpage(0)_A$~$Fpage(11)_A$) to the first through to the twelfth pages $Fpage(0)_B$~$Fpage(11)_B$ within the second block B, and changes at least one associated logical-to-physical address linking table to make at least one logical address that originally links to the first through to the twelfth pages $Fpage(0)_A$~$Fpage(11)_A$ of the first block A (e.g. the logical page addresses LPA 100~111) link to at least one memory page of the second block B, such as the first through to the twelfth pages $Fpage(0)_B$~$Fpage(11)_B$ within the second block B. Afterward, when the host device is going to read the data of the aforementioned at least one logical address (e.g. the logical page addresses LPA 100~111), the memory controller 110 looks it up in the changed logical-to-physical address linking table, and reads the data stored in the first through to the twelfth pages $Fpage(0)_B$~$Fpage(11)_B$ within the second block B and replies to the host device's request with the read data. In practice, the controller can label the valid pages located at the first through to the twelfth pages $Fpage(0)_A$~$Fpage(11)_A$ within the first block A as invalid pages (rather than erasing them immediately), so the first through to the twelfth pages $Fpage(0)_A$~$Fpage(11)_A$ can be regarded as moved or deleted pages. Next, the memory controller 110 writes the data $P_{12}$ ($H_1$) corresponding to the writing command $H_1$ into the thirteenth page $Fpage(12)_B$ of the second block B.

Then, when receiving a writing command $H_2$ from the host device, the memory controller 110 first moves a portion of valid pages within the first block A (e.g. the valid pages located at the fourteenth through to the fortieth pages $Fpage(13)_A$~$Fpage(39)_A$) to the fourteenth through to the fortieth pages $Fpage(13)_B$~$Fpage(39)_B$ within the second block B, and changes at least one associated logical-to-physical address linking table to make at least one logical address that originally links to the fourteenth through to the fortieth pages $Fpage(13)_A$~$Fpage(39)_A$ of the first block A (e.g. the logical page addresses LPA 313~339) link to at least one memory page of the second block B, such as the fourteenth through to the fortieth pages $Fpage(13)_B$~$Fpage(39)_B$ within the second block B. Afterward, when the host device is going to read the data of the at least one logical address (e.g. the logical page addresses LPA 313~339), the memory controller 110 looks it up in the changed logical-to-physical address linking table, and reads the data stored in the fourteenth through to the fortieth pages $Fpage(13)_B$~$Fpage(39)_B$ within the second block B and replies to the host device's request with the read data. In practice, the controller can label the valid pages located at the fourteenth through to the fortieth pages $Fpage(13)_A$~$Fpage(39)_A$ within the first block A as invalid pages (rather than erasing them immediately), so the fourteenth through to the fortieth pages $Fpage(13)_A$~$Fpage(39)_A$ can be regarded as moved or deleted pages. Next, the memory controller 110 writes the data $P_{40}(H_2)$ corresponding to the writing command $H_2$ into the forty-first page $Fpage(40)_B$ of the second block B.

Subsequently, when receiving a writing command $H_3$ from the host device, the memory controller 110 first moves two portions of valid pages within the first block A (e.g. the valid pages located at the forty-first through to the fifty-fifth pages $Fpage(40)_A$~$Fpage(54)_A$, and the valid pages located at the fifty-seventh through to the seventy-fifth pages $Fpage(56)_A$~$Fpage(74)_A$) to the forty-second through to the seventy-fifth pages $Fpage(41)_B$~$Fpage(74)_B$ within the second block B, and changes at least one associated logical-to-physical address linking table to make the logical addresses that originally link to the forty-first through to the fifty-fifth pages $Fpage(40)_A$~$Fpage(54)_A$ and the fifty-seventh through to the seventy-fifth pages $Fpage(56)_A$~$Fpage(74)_A$ of the first block A (e.g. the logical page addresses LPA 740-754 and LPA 256-274) link to some memory pages of the second block B, such as the forty-second through to the seventy-fifth pages $Fpage(41)_B$~$Fpage(74)_B$ within the second block B. Afterward, when the host device is going to read the data of the logical address (e.g. the logical page addresses LPA 740-754 and LPA 256-274), the memory controller 110 looks it up in the changed logical-to-physical address linking table, and reads the data stored in the forty-second through to the seventy-fifth pages $Fpage(41)_B$~$Fpage(74)_B$ within the second block B and replies to the host device's request with the read data. In practice, the controller can label the two portions of valid pages respectively located at the forty-first through to the fifty-fifth pages $Fpage(40)_A$~$Fpage(54)_A$ and the fifty-seventh through to the seventy-fifth pages Fpage$(56)_A$~Fpage$(74)_A$ within the first block A as invalid pages, so the two portions of pages can be regarded as moved or deleted pages. Next, the memory controller 110 writes the data $P_{75}(H_3)$ corresponding to the writing command $H_3$ into the seventy-sixth page Fpage$(75)_B$ of the second block B. Please note that, in this embodiment, the memory controller 110 can move the data of the portion of valid pages of the first block A to any memory page of the second block B, without having need to move the data of the portion of valid pages of the first block A to any memory page corresponding to the portion of valid pages of the first block A within the second block B. For example, the memory controller 110 moves the data of the forty-first through to the fifty-fifth pages Fpage$(40)_A$~Fpage$(54)_A$ within the first block A to the forty-second through to the fifty-sixth pages Fpage$(41)_B$~Fpage$(55)_B$ within the second block B, rather than moving the data to the forty-first through to the fifty-fifth pages Fpage$(40)_B$~Fpage$(54)_B$ within the second block B.

Afterward, according to some other events or the aforementioned at least one criterion, the memory controller 110 can trigger the operation of moving the data of the remaining valid pages of the first block A (e.g. the valid pages located at the seventy-sixth through to the ninetieth pages Fpage$(75)_A$~Fpage$(89)_A$, and the valid pages located at the ninety-second through to the one hundred and twenty-eighth pages Fpage$(91)_A$~Fpage$(127)_A$) to the second block B.

In this embodiment, according to the location of the invalid page Fpage$(12)_A$, the memory controller 110 can determine the data amount of the valid pages to be moved at a certain time (e.g. the first time). In addition, according to a predetermined data-moving amount of the first block A (e.g. 27 pages, regarding the valid pages located at the fourteenth through to the fortieth pages Fpage$(13)_A$~Fpage$(39)_A$), the memory controller 110 can determine the data amount of the valid pages to be moved at a certain time (e.g. the second time). Additionally, according to a predetermined data-writing amount of the second block B (e.g. 34 pages, regarding the valid pages located at the forty-first through to the fifty-fifth pages Fpage$(40)_A$~Fpage$(54)_A$ and the valid pages located at the fifty-seventh through to the seventy-fifth pages Fpage$(56)_A$~Fpage$(74)_A$), the memory controller 110 can determine the data amount of the valid pages to be moved at a certain time (e.g. the third time). This is for illustrative purposes only, and is not meant to be a limitation of the present invention. Please note that the upper bond of the data amount of the valid pages to be moved at a certain time can be determined according to related standards of memory cards, such as the SD standards. For example, the SD standards require an SD memory card to complete a writing operation of 512 bytes within 250 milliseconds (ms). Thus, the memory controller 110 has to calculate the total time required for moving data of N valid pages from the first block A to the second block B and writing 512 bytes of new data into the second block B, in order to make both operations (i.e. moving data of N valid pages and writing 512 bytes of new data) be completed within 250 milliseconds. As a result, the memory controller 110 can estimate and obtain the upper bond of the parameter N, i.e. the upper bond of the data amount of the valid pages to be moved at a certain time.

Figure 4:
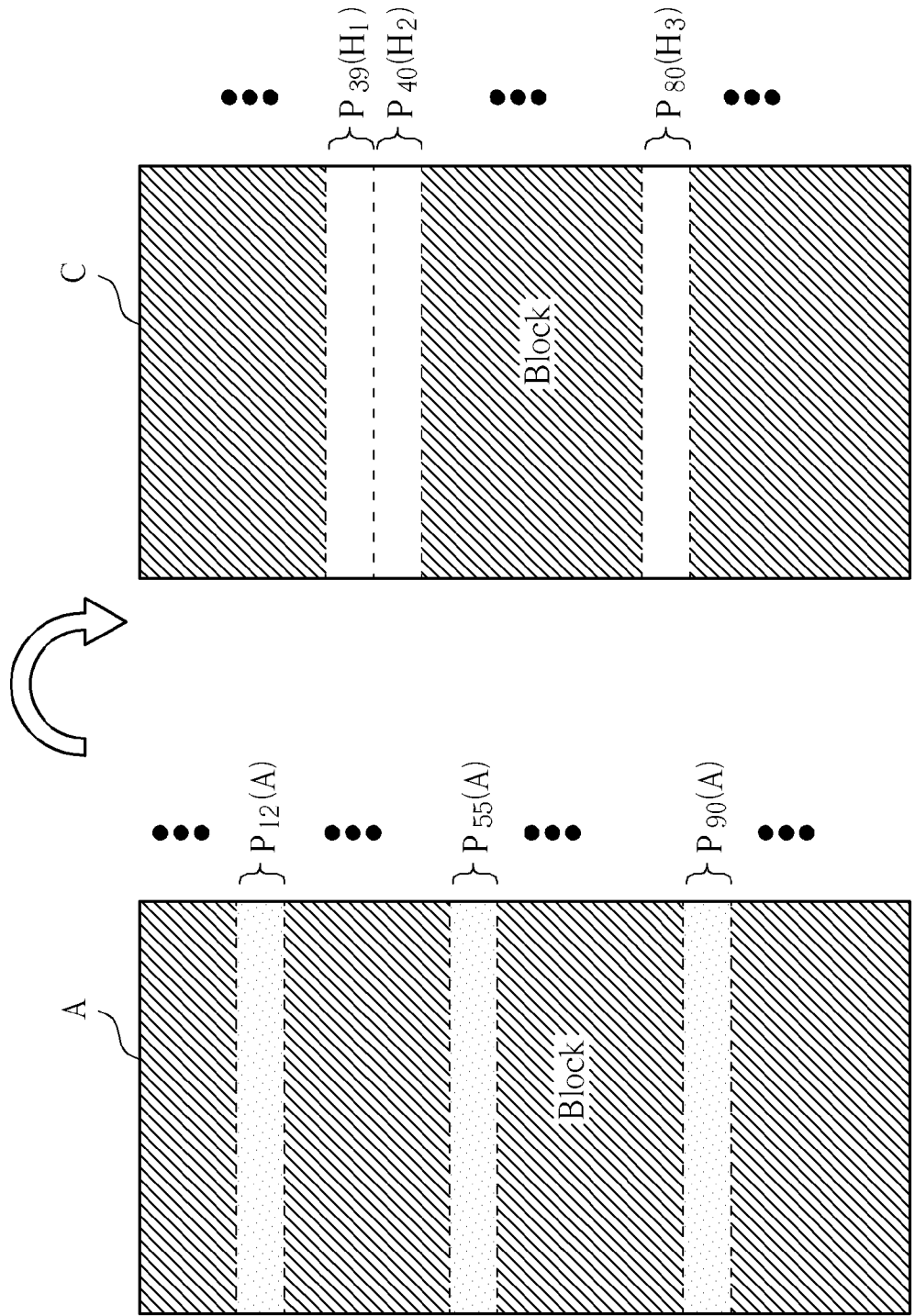
FIG. 4 is a diagram illustrating certain blocks involved with the method shown in FIG. 2 according to another embodiment of the present invention.

According to a variation of this embodiment, according to at least one predetermined host device data writing location of the second block, the memory controller 110 can determine the data amount of the valid pages to be moved at a certain time and the time point for moving these valid pages. FIG. 4 is a diagram illustrating certain blocks involved with the method shown in FIG. 2 according to another embodiment of the present invention, where this embodiment is another variation of the embodiment shown in FIG. 2, and is a variation of the embodiment shown in FIG. 3. Here, the blocks A and C respectively represent the first block and the second block mentioned above. In this embodiment, according to at least one predetermined host device data writing location of the second block C, the memory controller 110 can determine the data amount of the valid pages to be moved at a certain time. For example, the aforementioned at least one predetermined host device data writing location comprises a plurality of locations having equal intervals or quasi-equal intervals. In another example, the aforementioned at least one predetermined host device data writing location comprises a plurality of locations corresponding to equal data-moving amounts or quasi-equal data-moving amounts.

As shown in FIG. 4, the data of the valid pages originated from the first block A within the second block C of this embodiment (i.e. the shaded region in the second block C) can be divided into three portions, and the three portions have approximately equal percentages within the second block C. In addition, the aforementioned data $P_{12}(H_1)$ corresponding to the writing command $H_1$ is written into the fortieth page Fpage$(39)_C$ in this embodiment, and can still be labeled $P_{40}(H_2)$. Additionally, the aforementioned data $P_{75}(H_3)$ corresponding to the writing command $H_3$ is written into the eighty-first page Fpage$(80)_C$ in this embodiment, and can be labeled $P_{80}(H_3)$. Similar descriptions for this embodiment are not repeated in detail.

Figure 5:
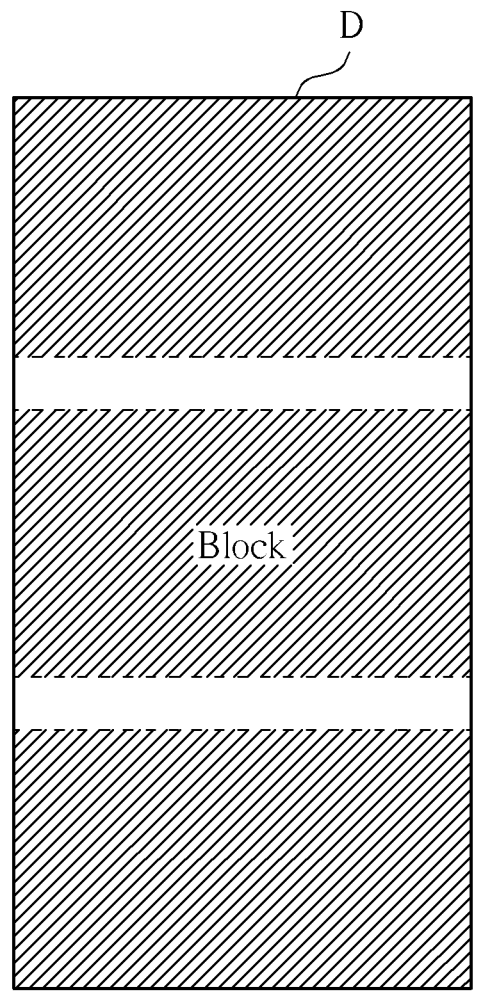
FIG. 5 is a diagram illustrating a certain block involved with the method shown in FIG. 2 according to another embodiment of the present invention.

FIG. 5 is a diagram illustrating a certain block involved with the method shown in FIG. 2 according to another embodiment of the present invention, where this embodiment is another variation of the embodiment shown in FIG. 2, and is a variation of the embodiment shown in FIG. 4. Here, the block D shown in FIG. 5 represents the second block mentioned above.

As shown in FIG. 5, the data of the valid pages originated from the first block A within the second block D of this embodiment (i.e. the shaded region in the second block D) is substantially divided into three equal portions, and the memory controller 110 moves the data of the valid pages of the first block A to the second block D in batches, at three respective times, where during this period, there are two writing commands $H_{11}$ and $H_{12}$ received by the memory controller 110 from the host device in total. In addition, when receiving the writing command $H_{11}$, the memory controller 110 first moves the first (or the upper) one-third portion of valid pages within the first block A to the second block D, and subsequently writes the data corresponding to the writing command $H_{11}$. Then, when receiving the writing command $H_{12}$, the memory controller 110 moves the next one-third portion of valid pages within the first block A to the second block D, and subsequently writes the data corresponding to the writing command $H_{12}$. Additionally, according to some other events or the aforementioned at least one criterion, the memory controller 110 can trigger the operation of moving the data of the last one-third portion of valid pages within the first block A to the second block D. Similar descriptions for this embodiment are not repeated in detail.

Figure 6:
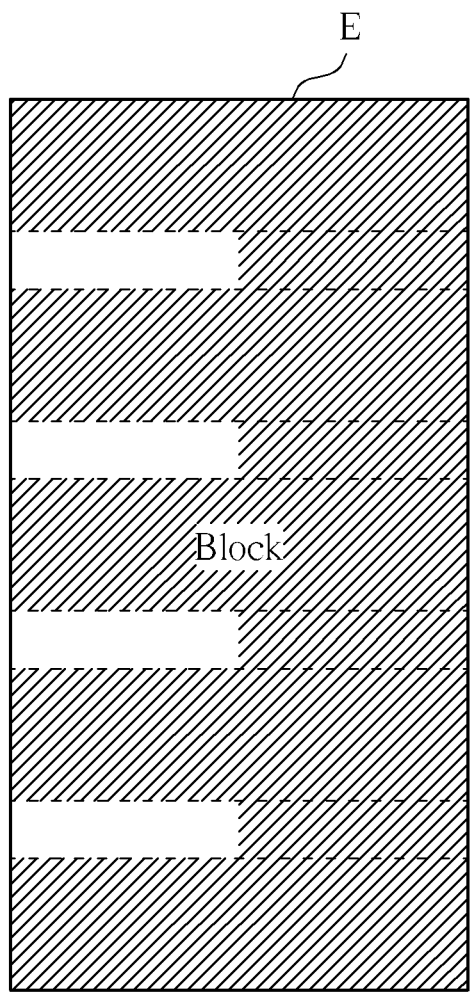
FIG. 6 is a diagram illustrating a certain block involved with the method shown in FIG. 2 according to another embodiment of the present invention.

FIG. 6 is a diagram illustrating a certain block involved with the method shown in FIG. 2 according to another embodiment of the present invention, where this embodiment is another variation of the embodiment shown in FIG. 2, and is a variation of the embodiment shown in FIG. 5. Here, the block E shown in FIG. 6 represents the second block mentioned above. Differences between this embodiment and the embodiment shown in FIG. 5 are described as follows.

As shown in FIG. 6, the data of the valid pages originated from the first block A within the second block E of this embodiment (i.e. the shaded region in the second block E) is approximately divided into five equal portions, and the memory controller 110 moves the data of the valid pages of the first block A to the second block E in batches, at five respective times, where during this period, there are two writing commands $H_{11}$ and $H_{12}$ received by the memory controller 110 from the host device in total. In addition, when receiving the writing command $H_{11}$, the memory controller 110 writes the data corresponding to the writing command $H_{11}$ into the second block E in batches, and more particularly, writes the data into the second block E at two respective times. Similarly, when receiving the writing command $H_{12}$, the memory controller 110 writes the data corresponding to the writing command $H_{12}$ into the second block E in batches, and more particularly, writes the data into the second block E at two respective times. Similar descriptions for this embodiment are not repeated in detail.

Additionally, when the present invention is applied to a Flash memory having a plurality of planes, better performance can be obtained in contrast to the related art. During writing data into the Flash memory having a plurality of planes (e.g. two planes), a plurality of pages (e.g. two pages) can be written/programmed at the same time. As a result, when moving data (e.g. moving data of a half of a block) or writing data, the memory controller can complete the moving or writing operation within a shorter time period in contrast to the related art. Therefore, the portable memory device can hardly exceed the time limited by related standards of Flash memory cards.

Those skilled in the art will readily observe that numerous modifications and alterations of the device and method may be made while retaining the teachings of the invention.

What is claimed is:

1. A method for managing a plurality of blocks of a Flash memory, the method being applied to a controller of a memory device, which comprises the Flash memory, the method comprising:
    after a specific host command is received from a host device external to the memory device, selecting at least one first block having invalid pages from the plurality of blocks in response to the specific host command received from the host device; and
    after the at least one first block is selected, determining a first portion of valid pages of the first block to be moved according to time required for moving the portion of valid pages, and moving the first portion of valid pages of the first block, rather than all valid pages of the first block, to a second block corresponding to the specific host command;
    after the first portion of valid pages of the first block is moved to the second block, receiving another host command from the host device, and moving a second portion of valid pages of the first block to the second block corresponding to the another host command, wherein the second portion of valid pages are different from the first portion of valid pages;
    wherein the specific host command is a writing command, and the step of moving the first portion of valid pages of the first block to the second block further comprises:
        after receiving the writing command from the host device, writing data corresponding to the writing command into the second block and utilizing the write command to trigger an operation of moving data of the first portion of valid pages of the first block to the second block.

2. The method of claim 1, wherein the step of selecting the first block having the invalid pages from the plurality of blocks further comprises:
    selecting the first block having the invalid pages from the plurality of blocks according to valid page counts or invalid page counts of at least a portion of blocks within the plurality of blocks.

3. The method of claim 2, wherein the portion of blocks comprises all of the plurality of blocks.

4. The method of claim 2, further comprising:
    recording the invalid page counts of the portion of blocks.

5. The method of claim 2, further comprising:
    recording the valid page counts of the portion of blocks.

6. The method of claim 1, wherein the step of selecting the first block having the invalid pages from the plurality of blocks further comprises:
    selecting at least one block having more invalid pages than others from the plurality of blocks as the first block.

7. The method of claim 1, wherein the step of selecting the first block having the invalid pages from the plurality of blocks further comprises:
    selecting at least one block with the highest invalid page count from the plurality of blocks as the first block.

8. The method of claim 1, wherein the step of moving the first portion of valid pages of the first block to the second block further comprises:
    before writing the data corresponding to the writing command into the second block, moving the data of the first portion of valid pages of the first block to the second block.

9. The method of claim 1, wherein the step of moving the first portion of valid pages of the first block to the second block further comprises:
    after writing the data corresponding to the writing command into the second block, moving the data of the first portion of valid pages of the first block to the second block.

10. The method of claim 1, further comprising:
    labeling the first portion of valid pages of the first block as invalid pages.

11. The method of claim 1, wherein the step of moving the portion of valid pages of the first block to the second block further comprises:
    changing a logical-to-physical address linking table to make at least one logical address that originally links to the first portion of valid pages of the first block link to at least one memory page of the second block.

12. The method of claim 1, wherein the step of moving the first portion of valid pages of the first block to the second block further comprises:
    moving pages from the first portion of valid pages of the first block to different pages in the second block.

13. The method of claim 1, wherein the step of moving the first portion of valid pages of the first block to the second block further comprises:
    moving data of the first portion of valid pages of the first block to the second block, with each valid page of the first portion of valid pages of the first block being moved to a corresponding page within the second block.

14. The method of claim 1, wherein the step of moving the first portion of valid pages of the first block to the second block further comprises:
    moving data of different portions of valid pages of the first block to different planes of the Flash memory, respectively, before the next host command is received.

15. The method of claim 1, wherein the time required for moving the first portion of valid pages represents time required for moving data of a specific amount corresponding to a parameter N; and the method further comprises:
calculating the time required for moving the data of the specific amount corresponding to the parameter N.

16. The method of claim 1, wherein the time required for moving the first portion of valid pages represents time required for moving data of a specific amount corresponding to a parameter N; and the method further comprises:
estimating an upper bound of the parameter N in advance.

17. A memory device, comprising:
a Flash memory comprising a plurality of blocks; and
a controller arranged to access the Flash memory and manage the plurality of blocks, wherein after a specific host command is received from a host device external to the memory device, the controller selects at least one first block having invalid pages from the plurality of blocks in response to the specific host command received from the host device, and after the at least one first block is selected, the controller determines a first portion of valid pages of the first block to be moved according to time required for moving the portion of valid pages, and moves the first portion of valid pages of the first block, rather than all valid pages of the first block, to a second block corresponding to the specific host command; after the first portion of valid pages of the first block is moved to the second block, the controller further receives another host command from the host device, and moves a second portion of valid pages of the first block to the second block corresponding to the another host command, wherein the second portion of valid pages are different from the first portion of valid pages;
wherein the specific host command is a writing command; and after receiving the writing command from the host device, the controller writes data corresponding to the writing command into the second block and utilizes the write command to trigger an operation of moving data of the first portion of valid pages of the first block to the second block.

18. The memory device of claim 17, wherein the controller selects the first block having the invalid pages from the plurality of blocks according to valid page counts or invalid page counts of at least a portion of blocks within the plurality of blocks.

19. The memory device of claim 18, wherein the portion of blocks comprises all of the plurality of blocks.

20. The memory device of claim 18, wherein the controller records the invalid page counts of the portion of blocks.

21. The memory device of claim 18, wherein the controller records the valid page counts of the portion of blocks.

22. The memory device of claim 17, wherein the controller selects at least one block having more invalid pages than others from the plurality of blocks as the first block.

23. The memory device of claim 17, wherein the controller selects at least one block with the highest invalid page count from the plurality of blocks as the first block.

24. The memory device of claim 17, wherein before writing the data corresponding to the writing command into the second block, the controller moves the data of the first portion of valid pages of the first block to the second block.

25. The memory device of claim 14, wherein after writing the data corresponding to the writing command into the second block, the controller moves the data of the first portion of valid pages of the first block to the second block.

26. The memory device of claim 17, wherein the controller further labels the first portion of valid pages of the first block as invalid pages.

27. The memory device of claim 17, wherein the controller changes a logical-to-physical address linking table to make at least one logical address that originally links to the first portion of valid pages of the first block link to at least one memory page of the second block.

28. The memory device of claim 17, wherein the controller moves pages from the first portion of valid pages of the first block to different pages in the second block.

29. The memory device of claim 17, wherein the controller moves data of the first portion of valid pages of the first block to the second block, with each valid page of the first portion of valid pages of the first block being moved to a corresponding page within the second block.

30. The memory device of claim 17, wherein the controller moves data of different portions of valid pages of the first block to different planes of the Flash memory, respectively, before the next host command is received.

31. The memory device of claim 17, wherein the time required for moving the first portion of valid pages represents time required for moving data of a specific amount corresponding to a parameter N; and the controller calculates the time required for moving the data of the specific amount corresponding to the parameter N.

32. The memory device of claim 17, wherein the time required for moving the first portion of valid pages represents time required for moving data of a specific amount corresponding to a parameter N; and the controller estimates an upper bound of the parameter N in advance.

33. A controller of a memory device, the controller being utilized for accessing a Flash memory comprising a plurality of blocks, the controller comprising:
a read only memory (ROM) arranged to store a program code; and
a microprocessor arranged to execute the program code to control the access to the Flash memory and manage the plurality of blocks;
wherein after a specific host command is received from a host device external to the memory device, the controller that executes the program code by utilizing the microprocessor selects at least one first block having invalid pages from the plurality of blocks in response to the specific host command received from the host device, and after the at least one first block is selected, the controller that executes the program code by utilizing the microprocessor determines a first portion of valid pages of the first block to be moved according to time required for moving the first portion of valid pages, and moves the portion of valid pages of the first block, rather than all valid pages of the first block, to a second block corresponding to the specific host command; after the first portion of valid pages of the first block is moved to the second block, the controller further receives another host command from the host device, and moves a second portion of valid pages of the first block to the second block corresponding to the another host command, wherein the second portion of valid pages are different from the first portion of valid pages; wherein the specific host command is a writing command; and after receiving the writing command from the host device, the controller that executes the program code by utilizing the microprocessor writes data corresponding to the writing command into the second block and utilizes the write command to trigger an operation of moving data of the first portion of valid pages of the first block to the second block.

34. The controller of claim 33, wherein the controller that executes the program code by utilizing the microprocessor selects the first block having the invalid pages from the plurality of blocks according to valid page counts or invalid page counts of at least a portion of blocks within the plurality of blocks.

35. The controller of claim 34, wherein the portion of blocks comprises all of the plurality of blocks.

36. The controller of claim 34, wherein the controller that executes the program code by utilizing the microprocessor records the invalid page counts of the portion of blocks.

37. The controller of claim 34, wherein the controller that executes the program code by utilizing the microprocessor records the valid page counts of the portion of blocks.

38. The controller of claim 33, wherein the controller that executes the program code by utilizing the microprocessor selects at least one block having more invalid pages than others from the plurality of blocks as the first block.

39. The controller of claim 33, wherein the controller that executes the program code by utilizing the microprocessor selects at least one block with the highest invalid page count from the plurality of blocks as the first block.

40. The controller of claim 33, wherein before writing the data corresponding to the writing command into the second block, the controller that executes the program code by utilizing the microprocessor moves the data of the first portion of valid pages of the first block to the second block.

41. The controller of claim 33, wherein after writing the data corresponding to the writing command into the second block, the controller that executes the program code by utilizing the microprocessor moves the data of the first portion of valid pages of the first block to the second block.

42. The controller of claim 33, wherein the controller that executes the program code by utilizing the microprocessor further labels the first portion of valid pages of the first block as invalid pages.

43. The controller of claim 33, wherein the controller that executes the program code by utilizing the microprocessor changes a logical-to-physical address linking table to make at least one logical address that originally links to the first portion of valid pages of the first block link to at least one memory page of the second block.

44. The controller of claim 33, wherein the controller that executes the program code by utilizing the microprocessor moves pages from the first portion of valid pages of the first block to different pages in the second block.

45. The controller of claim 33, wherein the controller that executes the program code by utilizing the microprocessor moves data of the first portion of valid pages of the first block to the second block, with each valid page of the first portion of valid pages of the first block being moved to a corresponding page within the second block.

46. The controller of claim 33, wherein the controller that executes the program code by utilizing the microprocessor moves data of different portions of valid pages of the first block to different planes of the Flash memory, respectively, before the next host command is received.

47. The controller of claim 33, wherein the time required for moving the first portion of valid pages represents time required for moving data of a specific amount corresponding to a parameter N; and the controller that executes the program code by utilizing the microprocessor calculates the time required for moving the data of the specific amount corresponding to the parameter N.

48. The controller of claim 33, wherein the time required for moving the first portion of valid pages represents time required for moving data of a specific amount corresponding to a parameter N; and the controller that executes the program code by utilizing the microprocessor estimates an upper bound of the parameter N in advance.

* * * * *